United States Patent
He et al.

(10) Patent No.: US 9,627,263 B1
(45) Date of Patent: Apr. 18, 2017

(54) STOP LAYER THROUGH ION IMPLANTATION FOR ETCH STOP

(71) Applicant: International Business Machines Corporation, Armonk, NY (US)

(72) Inventors: Hong He, Armonk, NY (US); Siva Kanakasabapathy, Armonk, NY (US); Yunpeng Yin, Armonk, NY (US); Chiahsun Tseng, Armonk, NY (US); Junli Wang, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/953,461

(22) Filed: Nov. 30, 2015

(51) Int. Cl.
| | |
|---|---|
| H01L 27/12 | (2006.01) |
| H01L 21/8234 | (2006.01) |
| H01L 21/308 | (2006.01) |
| H01L 27/088 | (2006.01) |
| H01L 21/265 | (2006.01) |
| H01L 21/3065 | (2006.01) |
| H01L 29/78 | (2006.01) |

(52) U.S. Cl.
CPC ........... *H01L 21/823431* (2013.01); *H01L 21/26533* (2013.01); *H01L 21/3065* (2013.01); *H01L 21/3081* (2013.01); *H01L 27/0886* (2013.01); *H01L 29/785* (2013.01)

(58) Field of Classification Search
CPC ........... H01L 21/823431; H01L 21/845; H01L 27/0886; H01L 21/3065; H01L 21/3081; H01L 29/785
USPC ........................................... 257/347
See application file for complete search history.

(56) References Cited

U.S. PATENT DOCUMENTS

| | | |
|---|---|---|
| 5,783,494 A | 7/1998 | Sakurai et al. |
| 5,874,362 A | 2/1999 | Wong et al. |
| 6,429,538 B1 | 8/2002 | Lin |
| 6,642,090 B1 | 11/2003 | Fried et al. |
| 7,422,936 B2 | 9/2008 | Barns et al. |
| 7,491,630 B2 | 2/2009 | Shroff et al. |
| 7,625,776 B2 | 12/2009 | Wells et al. |

(Continued)

OTHER PUBLICATIONS

Y. H. Lee et al., "Doping effects in reactive plasma etching of heavily doped silicon," Applied Physics Letters, vol. 46, No. 3, 1985, pp. 260-262.

(Continued)

*Primary Examiner* — David Vu
*Assistant Examiner* — Brandon Fox

(57) ABSTRACT

A process for etching a bulk integrated circuit substrate to form features on the substrate, such as fins, having substantially vertical walls comprises forming an etch stop layer beneath the surface of the substrate by ion implantation, e.g., carbon, oxygen, or boron ions or combinations thereof, masking the surface with a patterned etching mask that defines the features by openings in the mask to produce a masked substrate and etching the masked substrate to a level of the etch stop layer to form the features. In silicon substrates, ion implantation takes place along a silicon crystalline lattice beneath the surface of the substrate. The etchant comprises a halogen material that etches undoped silicon faster than the implants-rich silicon layer. This produces a circuit where the fins do not taper away from the vertical where they meet the substrate, and corresponding products and articles of manufacture having these features.

6 Claims, 5 Drawing Sheets

(56) References Cited

U.S. PATENT DOCUMENTS

| | | | |
|---|---|---|---|
| 2008/0128797 A1* | 6/2008 | Dyer | H01L 29/785 257/328 |
| 2009/0014795 A1* | 1/2009 | Koh | H01L 29/785 257/347 |
| 2013/0009246 A1* | 1/2013 | Cheng | H01L 29/785 257/350 |

OTHER PUBLICATIONS

M. Masahara et al., "UltrathIn channel vertical DG MOSFET fabricated by using ion-bombardment-retarded etching," IEEE Transactions on Electron Devices, vol. 51, No. 12, 200.

* cited by examiner

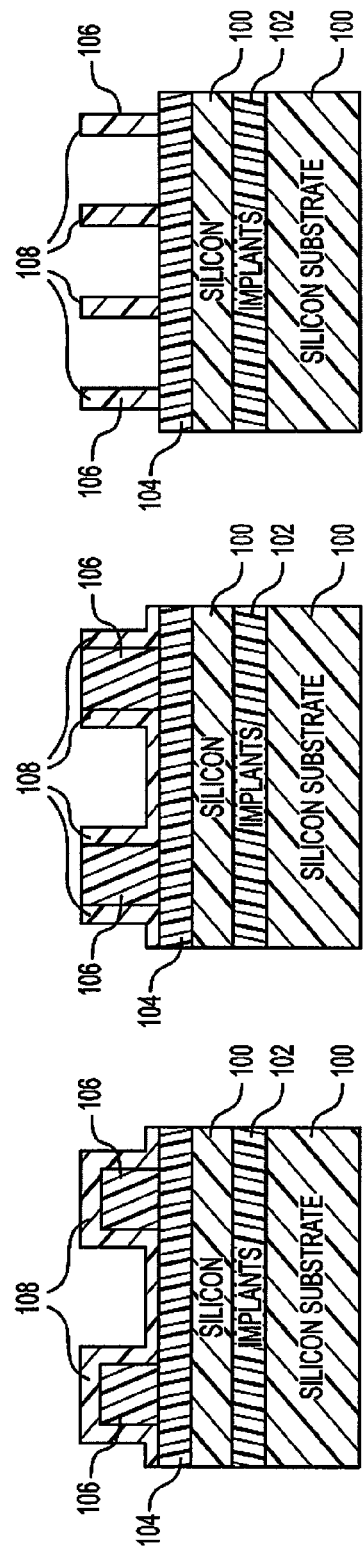

STOP LAYER THROUGH ION IMPLANTATION FOR ETCH STOP

FIELD OF THE INVENTION

The field of the invention comprises integrated circuits and in one aspect processes for the formation of FinFET-type integrated circuit devices and devices produced by such processes.

BACKGROUND OF THE INVENTION

In order to improve the output of integrated circuits, fabricators have increased the number of transistors on the circuit substrate by increasing its surface area by means of fins, usually formed from the same material as the substrate, and projecting upwardly from the surface. Selectively doping regions of the fins produces transistor structures.

The FIN structure provides a tri-gate (gate on both FIN sides and FIN top) structure. This tri-gate structure has better electrostatic control for a short-channel FET, in comparison to conventional planar devices. On other hand, it can provide more effective channel width per area than planar devices, i.e., it is more efficient than planar devices from an area scaling perspective.

This is part of the "silicon revolution" that drove the development of faster and larger computers beginning in the early 1960's giving rise to predictions of rapid growth because of the increasing numbers of transistors packed into integrated circuits with estimates they would double every two years. Since 1975, however, they doubled about every 18 months.

An active period of innovation in the 1970's followed in the areas of circuit design, chip architecture, design aids, processes, tools, testing, manufacturing architecture, and manufacturing discipline. The combination of these disciplines brought about the VLSI era and the ability to mass-produce chips with 100,000 transistors per chip at the end of the 1980's, succeeding the large scale Integration ("LSI") era of the 1970's with only 1,000 transistors per chip. (Carre, H. et al. "Semiconductor Manufacturing Technology at IBM", *IBM J. RES. DEVELOP.*, VOL. 26, no. 5, September 1982). Mescia et al. also describe the industrial scale manufacture of these VLSI devices. (Mescia, N.C. et al. "Plant Automation in a Structured Distributed System Environment," *IBM J. RES. DEVELOP.*, VOL. 26, no. 4, (July 1982).

The release of IBM's Power6™ chip in 2007, noted "miniaturization has allowed chipmakers to make chips faster by cramming more transistors on a single slice of silicon, to the point where high-end processors have hundreds of millions of transistors . . . ." (http://www.nytimes.com/reuters/technology/tech-ibm-power.html?pagewanted=print (Feb. 7, 2006))

More recently, "engineers did a rough calculation of what would happen had a 1971 Volkswagen Beetle improved at the same rate as microchips did under Moore's Law: 'Here are the numbers: [Today] you would be able to go with that car 300,000 miles per hour. You would get two million miles per gallon of gas, and all that for the mere cost of 4 cents!'" T. Friedman, N.Y. Times, Op Ed, May 13, 2015.

Technology scaling of semiconductor devices to 90 nm and below has provided many benefits in the field of microelectronics, but has introduced new considerations as well. While smaller chip geometries result in higher levels of on-chip integration and performance, higher current and power densities, increased leakage currents, and low-k dielectrics that present new challenges to package designs.

The FinFET transistor evolved from these considerations. It has at least one thin portion, referred to as the "fin," comprising a semiconductor material that defines the elongated section to form the channel of the transistor and also includes source and drain zones. In the process, a mask formed on top of a monocrystalline silicon substrate defines the fin and its position. Once defined, etching the substrate material directionally around the mask, to a determined depth, allows the elongated section defining the fin to remain under the mask and retain its composition as substrate material.

Some integrated circuits employ one or more FinFET type field effect transistors having a channel region oriented to conduct an electrical current parallel to the surface of the transistor substrate. The channel region sits in an elongated section of semiconductor material referred to as a fin with the elongated section located on either side of the channel. It usually includes the source and drain regions of the transistor. Positioning a gate over and on both opposed sides of the elongated section at the location of the channel provides a means to control the transistor's conductive state. Intermediate gate portions of the transistor gate span the multiple elongated sections perpendicular to the neighboring channel regions and separate them. Fabricators use this FinFET design for manufacturing multi-channel transistors with multiple elongated sections formed in parallel to define neighboring channel regions.

This semiconductor material fin (a FinFET), comprises the channel of the final transistor, but is not electrically insulated from the active portion of the crystalline semiconductor material circuit substrate. This device suffers from three distinct types of leakage current: first, a type of leakage current, internal to each transistor, that can circulate between the source and drain of the FinFET transistor via the active portion of the substrate situated below the channel; the potential applied to the transistor gate does not control this; second, a type of leakage current develops because the channel of the FinFET transistor is also in electrical contact, via the substrate, with the channels of other transistors of the same conductivity type; in the second, leakage current flows between transistors in the form of an inter-transistor leakage current; and third, leakage current appears between the channel of each FinFET transistor and a lower part of the substrate in response to the substrate being connected to a reference potential.

Bottom oxidation through STIs (BOTS), however, allows for dielectrically isolating the fin by forming shallow trench isolation (STI) structures on either side of the fin. The silicon material of the fin is protected on a top side by a silicon nitride oxygen barrier layer and the upper lateral sides of the fin are isolated from the STI structures by another silicon nitride oxygen barrier layer, followed by an oxidation process to convert a lower unmasked, i.e., unprotected, portion of the fin below the lateral barrier layers to a thermal oxide material which isolates the upper portion of the fin from the underlying substrate material. This, however, produces an undesirable scalloped interface shape at the bottom of the fin, inherent in thermal oxide growth. Also, the process does not work well with fins made from silicon-germanium (SiGe) and does not readily lend itself to forming p-channel SiGe FinFET devices.

A related so-called "silicon on nothing (SON)" process forms the bottom portion of a fin from silicon-germanium and the upper portion from silicon. This involves removing the silicon-germanium bottom portion by selective etching to open a region between the underside of the Si fin and the underlying substrate followed by filling the opened region with an insulating material; however, in many instances this not only produces Si fins with unacceptable mechanical stability, but also results in incomplete fill of the opened region with the insulating material, i.e., tunnel fill issues.

FinFET transistors formed on Silicon-on-Insulator (SOI) integrated circuit substrates in lieu of bulk semiconductor substrates address leakage currents. SOI substrates comprise three layers; a top semiconductor layer, e.g., Si or Ge; an insulating intermediate layer; and a bottom semiconductor substrate layer such as a Si layer. The intermediate layer electrically insulates the transistor from the lower part of the substrate to substantially minimize or substantially eliminate these leakage currents Processing innovations have produced transistor fabrication substrates with a reduced intervening insulating layer thickness, about 50 nm, referred to as an extremely thin silicon on insulator (ETSOI) substrate. Further development reduced substrate thicknesses to now produce an intervening insulating layer about 25 nm or less and the top semiconductor layer about 5 nm to 10 nm. Fabricators refer to these as ultra-thin body and buried oxide (UTBB) substrates. All of these substrates comprise SOI substrates.

The FinFET transistor on an SOI substrate provides an excellent platform for fabricating smaller and smaller circuits, especially CMOS integrated circuits. The FinFET transistor allows superior short channel control along with higher performance as compared to conventional planar bulk devices, well recognized by fabricators as advantages of the FinFET for CMOS circuits.

Fabricators form the fin by etching into the bulk circuit substrate, but as noted, the fin profile tends to be tapered at the bottom due to plasma etch fundamental limitations. In BOTS fin formation it would be advantageous, however, to provide a process to form these fins without a tapered fin profile, i.e., to form a shallow fin with a substantially vertical fin sidewall profile.

The FIN width (DFin) has a strong impact on short-channel effect. If the FIN is tapered, i.e., small Dfin at the top but large Dfin at the bottom, the short channel effect is worse for the large Dfin. Thus the overall FIN device (FET) behavior will lose control, resulting in large variations. Therefore a vertical FIN sidewall is very important and required for device manufacturability.

RELATED ART

Loubet, et al. U.S. Pat. No. 9,136,384 describes a method for the formation of a FinFET device having a partially dielectric isolated Fin structure.

Loubet, et al. U.S. Pat. No. 9,099,570 describes a method for the formation of dielectric isolated Fin structures for use in FinFET devices.

Loubet, et al. United States Patent Application No. 20150162248 describes a method for the formation of dielectric isolated Fin structures for use in FinFET devices.

Loubet, et al. United States Patent Application No. 20150162433 describes a method for the formation of FinFET devices with epitaxially grown source-drain regions having a reduced leakage path.

Loubet, et al. United States Patent Application No. 20150162434 describes a method for the formation of FinFET devices having a partially dielectric isolated Fin structure.

Shroff, et al. U.S. Pat. No. 7,491,630 and Fried, et al. U.S. Pat. No. 6,642,090, also describe methods for manufacturing FinFET devices.

Shroff, et al. U.S. Pat. No. 5,783,494; Barns, et al. U.S. Pat. No. 7,422,936; Shroff, et al. U.S. Pat. No. 7,491,630; Wells, et al. U.S. Pat. No. 7,625,776; Wong, et al. U.S. Pat. No. 5,874,362; Lin, U.S. Pat. No. 6,429,538; and Fried, et al. U.S. Pat. No. 6,642,090 show various methods for manufacturing semiconductor structures either by dry etching, removal of sacrificial layers, gate patterning, selective etching and the like.

Y. H. LEE et al., Applied Physics Letters, Volume 46, No. 3, 1985, pp. 260-62 describe doping effects in reactive plasma etching of heavily doped silicon.

S. J. PEARTON et al. Journal of The Electrochemical Society, Volume 139, No. 6, 1992, pp. 1763-72 describe hydrogen iodide-based dry etching of GaAs, InP, and related compounds.

M. MASAHARA et al., IEEE Transactions on Electron Devices, Volume 51, No. 12, 2004, pp. 2078-85 describe ultrathin channel vertical DG MOSFET fabricated by ion-bombardment-retarded etching.

SUMMARY OF THE INVENTION

The present invention provides structures, articles of manufacture, processes, and products produced by these processes that address the forgoing needs to not only provide advantages over the related art, but also to substantially obviate one or more of the foregoing and other limitations and disadvantages of the related art by a process of forming an etch stop layer and then applying an over etch on a bulk substrate of an integrated circuit to enable formation of integrated circuit features such as fins having a substantially vertical sidewall profile.

Not only do the written description, claims, abstract of the disclosure and drawings set forth various features, objectives, and advantages of the invention and how they may be realized and obtained, but these features, objectives, and advantages will also become apparent by practicing the invention.

BRIEF DESCRIPTION OF THE DRAWINGS

The accompanying drawings are not necessarily drawn to scale but nonetheless set out the invention, and are included to illustrate various embodiments of the invention, and together with this specification also serve to explain the principles of the invention. These drawings comprise various Figures that illustrate structures and methods for producing fins on an integrated circuit by ion implantation of an etch stop layer on a circuit substrate followed by etching to produce fins having a substantially vertical sidewall profile.

FIGS. 1 FIGS. 1A through 1H illustrates an aspect of the present invention comprising side elevations in cross-section of devices produced in the steps of practicing the process of the invention. These comprise inter alia implanting an etch block material along the silicon lattice of a silicon substrate followed by forming substantially vertical fins on the substrate by means of an etching process.

DETAILED DESCRIPTION OF THE INVENTION

To achieve the foregoing and other advantages, and in accordance with the purpose of this invention as embodied and broadly described herein, the following detailed description comprises examples of the invention that can be embodied in various forms.

The specific processes, compounds, compositions, and structural details set out herein not only comprise a basis for the claims and a basis for teaching one skilled in the art how to employ the present invention in any novel and useful way, but also provide a description of how to make and use this invention. The written description, claims, abstract of the disclosure, and the drawings that follow set forth various features, objectives, and advantages of the invention and how they may be realized and obtained. These features, objectives, and advantages will also become apparent by practicing the invention.

The invention comprises, inter alia, a process for etching a integrated circuit substrate to form features on the substrate having or comprising a vertical wall configuration such as fins by the steps comprising forming an etch stop layer beneath the surface of the substrate by ion implantation, masking the surface with a patterned etching mask that defines the features by openings in the mask to produce a masked substrate, and etching the masked substrate to a level of the etch stop layer to form the features.

The substrate may comprise an undoped silicon substrate so that the process produces an undoped silicon layer on an implants-rich silicon layer which in turn is positioned on a silicon layer. Importantly, the features, such as the fins do not taper away from the vertical configuration where they meet the substrate.

In addition to Si substrates, we can employ Ge. SiGe or III-V substrates in the process of the invention and obtain corresponding products and articles of manufacture. The term III-V refers to elements employed in semiconductor manufacture based on Groups IIIA and VA of the Periodic Table of the Elements (CAS version).

We form the etch stop layer by implantation of at least one of carbon, oxygen, or boron ion or combinations thereof along a silicon crystalline lattice beneath the surface of the substrate.

We use a halogen etchant that etches undoped silicon faster than the implants-rich silicon layer, such as a halogen or a halogen compound, e.g., one of chlorine, hydrogen bromide or hydrogen iodide gasses and combinations thereof. The foregoing produces a product made by the process or an article of manufacture incorporating the foregoing features.

Figure 1C:
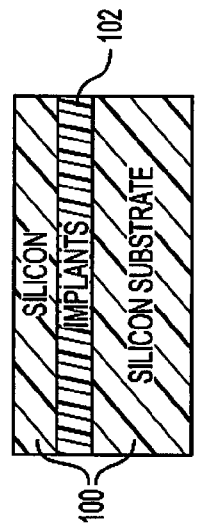
Figure 1B:
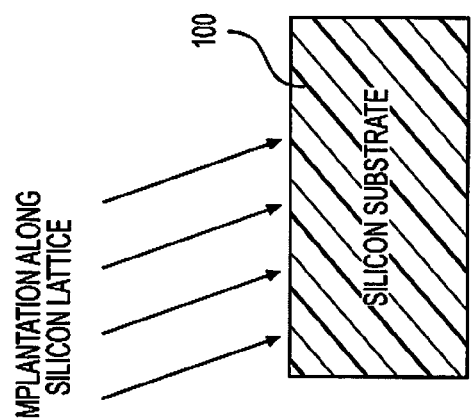
Figure 1A:
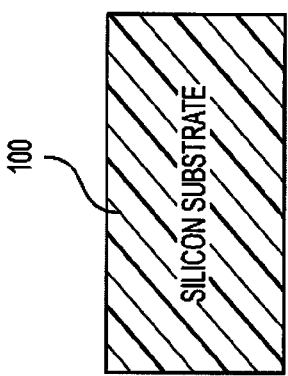
Figure 1G:
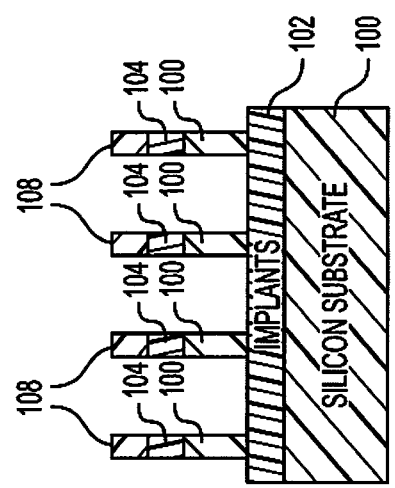
Figure 1H:
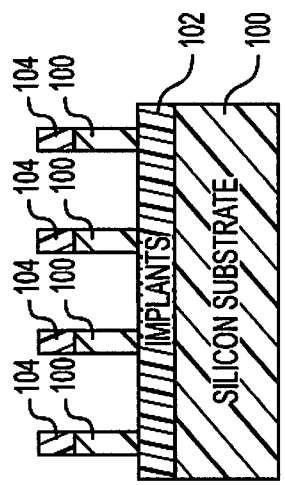
Figure 2C:
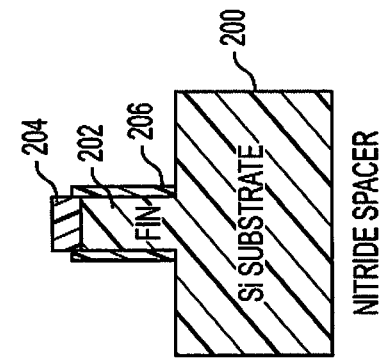
FIGS. 2A through 2F comprise side elevations in cross-section showing the manufacture of a prior art bottom oxidation through shallow trench isolation (BOTS) circuit substrate etched to form fins with a fin profile tapered at the bottom due to plasma etch fundamental limitations and which are taller than those of the present invention.
Figure 2B:
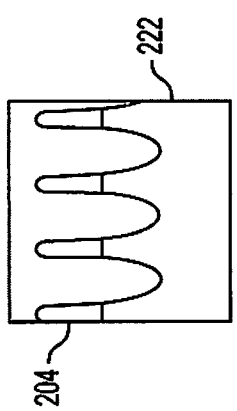
Figure 2A:
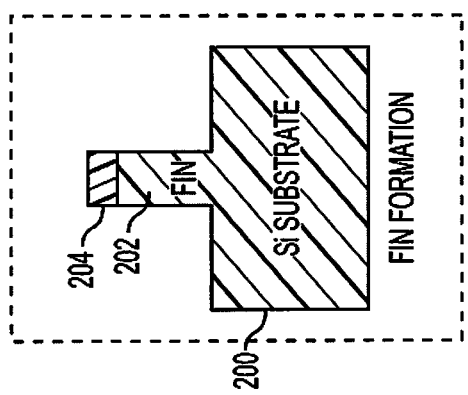
Figure 2F:
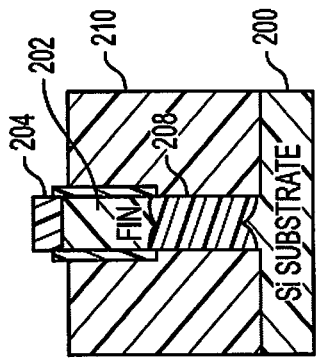
Figure 2E:
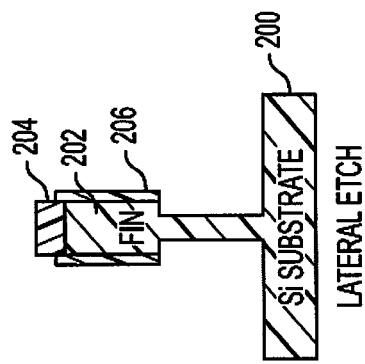
Figure 2D:
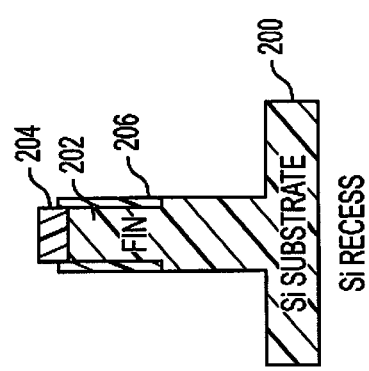

Referring to the drawings, FIG. 1A shows a silicon substrate 200 subsequently treated by ion implantation as described herein along the substrate's silicon lattice as illustrated in FIG. 1B. FIG. 1C shows ion implants 102 beneath the surface of the silicon substrate 100. We then form an etching structure on top of the structure shown in FIG. 1C by coating the surface of the substrate above the ion implant 102 with a SiN layer 104 and, then form a series of aSi (amorphous Si film) square-like projections 106 over layer 104, In this part of the process, We deposit an aSi film first and then perform a litho step to pattern the aSi after to form the aSi into patterns, called a mandrel or mandrels. We follow this by covering projections 106 with a layer 108 of ALD SiO$_2$ (Atomic Layer Deposition SiO$_2$) as illustrated by FIG. 1D. ALD SiO$_2$ is conformal deposition. We then remove the cap layer from the square-like projections 106 by etching or grinding and then remove the remaining aSi square-like projections by etching, followed by a subsequent etch to remove the aSi and the silicon layer 100 beneath it by the halogen etch described herein, continuing the etch to the ion-implant stop etch layer 102 that substantially prevents the etch from proceeding further, leaving a series of fins topped with a cap composed of aSi as illustrated by FIG. 1E, FIG. 1F, and FIG. 1G. Removal of the cap composed of aSi produces the present invention's shallow or short fin without a bottom taper as illustrated in FIG. 1H.

By contrast, FIGS. 2A through 2F, i.e., FIG. 2A, 2B, 2C, 2D, 2E, 2F, illustrate the prior art bottom oxidation through STIs (BOTS) process by etching silicon substrate 200 to form fins 202. This, however, produces an undesirable scalloped interface shape 222 at the bottom of the fin 202, inherent in thermal oxide growth. Dielectrically isolating silicon fin 202 on silicon substrate 200 results from forming a nitride cap 204 on top of fin 202. Shallow trench isolation (STI) structures (not illustrated) are provided on either side of fin 202. The silicon material of the fin 202 is protected on a top side by the silicon nitride oxygen barrier layer 204 and the upper lateral sides of the fin are isolated from the STI structures by the other silicon nitride oxygen barrier layer 206. The process also includes an oxidation step to convert the lower unmasked, i.e., unprotected, portion of the fin below the lateral barrier layers to form a thermal oxide material 208 that isolates the upper portion of the fin from the underlying substrate material 200. The prior art employs a process to obtain shallow trench isolation (STI) 210 by an oxide film fill, then oxide CMP stops on FIN hardmask (204). After that the oxide can be further recessed by RIE (reactive ion etching).

The present invention's ion implantation layer 102 eliminates the need for the thermal oxide material 208 that isolates the upper portion of the fin from the underlying substrate material 200 and enables the construction of a fin shorter than those produced by the BOTS process to provide the advantages set out herein.

In one embodiment we provide a process for etching a bulk integrated circuit substrate to form features comprising a vertical wall configuration on the substrate comprising forming an etch stop layer beneath the surface of the substrate by ion implantation, masking the surface with a patterned etching mask that defines the features by openings in the mask to produce a masked substrate, and etching the masked substrate to a level of the etch stop layer to form the features; wherein the features comprise fins on the substrate, the substrate may comprise an undoped silicon substrate so that the process produces an undoped silicon layer on an implants-rich silicon layer which in turn may be positioned on a silicon layer, and the fins do not taper away from the vertical configuration where they meet the substrate. Also, the implants may be formed along a silicon crystalline lattice beneath the surface of the substrate. In further embodiments etching may be conducted with a halogen etchant that etches undoped silicon faster than the implants-rich silicon layer. The etchant component may comprise one of chlorine, hydrogen bromide or hydrogen iodide gasses and combinations thereof. We also provide products made by any one of these processes.

Throughout this specification, and abstract of the disclosure, the inventors have set out equivalents, of various materials as well as combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter or the meaning ordinarily ascribed to these terms by a person with ordinary skill in the art. In another embodiment, the terms "about," "substantial," or "substantially," when employed to define numerical parameter include, e.g., a variation up to five per-cent, ten per-cent, or 15 per-cent, or somewhat higher. Applicants intend that terms used in the as filed or amended written description and claims of this application that are in the plural or singular shall also be construed to include both the singular and plural respectively when construing the scope of the present invention.

All scientific journal articles and other articles, including internet sites, as well as issued and pending patents that this written description or applicants' Invention Disclosure Statements mention, including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the references cited therein, as all or any one may bear on or apply in whole or in part, not only to the foregoing written description, but also the following claims, and abstract of the disclosure.

Although we describe the invention by reference to some embodiments, other embodiments defined by the doctrine of equivalents are intended to be included as falling within the broad scope and spirit of the foregoing written description, and the following claims, abstract of the disclosure, and drawings.

We claim:

1. A process for etching a bulk integrated circuit substrate to form features comprising a vertical wall configuration on said substrate comprising forming an etch stop layer beneath the surface of said substrate by ion implantation, masking said surface with a patterned etching mask that defines said features by openings in said mask to produce a masked substrate, and etching said masked substrate to a level of said etch stop layer to form said features; wherein said features comprises fins on said substrate, said substrate comprises an undoped silicon substrate so that said process produces an undoped silicon layer on an implants-rich silicon layer which in turn is positioned on a silicon layer, and said fins do not taper away from said vertical configuration where they meet said substrate; and wherein said implants are formed along a silicon crystalline lattice beneath the surface of said substrate.

2. The process of claim 1 wherein said etching is conducted with a halogen etchant that etches undoped silicon faster than said implants-rich silicon layer.

3. The process of claim 1 wherein said etchant comprises one of chlorine, hydrogen bromide or hydrogen iodide gasses and combinations thereof.

4. A product made by the process of claim 1.

5. A product made by the process of claim 2.

6. A product made by the process of claim 3.

* * * * *